(12) United States Patent
Yoon et al.

(10) Patent No.: US 11,538,847 B2
(45) Date of Patent: Dec. 27, 2022

(54) IMAGING SENSOR AND PIXEL STRUCTURE FOR SIMULTANEOUS IMAGING AND ENERGY HARVESTING

(71) Applicant: The Regents of the University of Michigan, Ann Arbor, MI (US)

(72) Inventors: Euisik Yoon, Ypsilanti, MI (US); Kyuseok Lee, Ann Arbor, MI (US); Sung-Yun Park, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 148 days.

(21) Appl. No.: 16/975,035

(22) PCT Filed: Feb. 22, 2019

(86) PCT No.: PCT/US2019/019263
§ 371 (c)(1),
(2) Date: Aug. 21, 2020

(87) PCT Pub. No.: WO2019/165288
PCT Pub. Date: Aug. 29, 2019

(65) Prior Publication Data
US 2021/0091134 A1   Mar. 25, 2021

Related U.S. Application Data

(60) Provisional application No. 62/634,510, filed on Feb. 23, 2018.

(51) Int. Cl.
*H01L 27/146* (2006.01)
*H04N 5/3745* (2011.01)
(Continued)

(52) U.S. Cl.
CPC .. *H01L 27/14643* (2013.01); *H01L 27/14605* (2013.01); *H01L 27/14679* (2013.01);
(Continued)

(58) Field of Classification Search
CPC ......... H01L 27/14679; H01L 27/14605; H01L 31/047; H01L 31/053; H04N 5/3745
See application file for complete search history.

(56) References Cited

U.S. PATENT DOCUMENTS 6,803,553 B1   10/2004   Tian
7,936,394 B2    5/2011   Wu
(Continued)

FOREIGN PATENT DOCUMENTS

JP    2007096201 A    4/2007
KR    20090126736 A   12/2009
WO    WO2016090144 A1  6/2016

OTHER PUBLICATIONS

J. Choi et al., "A 3.4-uW Object-Adaptive CMOS Image Sensor With Embedded Feature Extraction Algorithm for Motion-Triggered Object-of-Interest Imaging", IEEE Journal of Solid-State Circuits., vol. 49, No. 1, pp. 289-300, 2014.
(Continued)

*Primary Examiner* — David A Zarneke
(74) *Attorney, Agent, or Firm* — Reising Ethington P.C.

(57) ABSTRACT

An energy harvesting imaging sensor includes an array of pixel structures each formed from a semiconductor having a photodiode overlying a photovoltaic diode. The photodiode and photovoltaic diode are implemented as a vertically stacked P+/$N_{WELL}$/$P_{SUB}$ junction. This structure enables simultaneous imaging and energy harvesting by generating charge in the photodiode that is indicative of light impinging on the photodiode and simultaneously generating charge from the light in the photovoltaic diode located underneath the photodiode.

18 Claims, 5 Drawing Sheets

(51) Int. Cl.
   *H01L 31/047* (2014.01)
   *H01L 31/053* (2014.01)
(52) U.S. Cl.
   CPC .......... *H01L 31/047* (2014.12); *H01L 31/053* (2014.12); *H04N 5/37455* (2013.01)

(56) References Cited

U.S. PATENT DOCUMENTS

| | | | |
|---|---|---|---|
| 8,436,288 B2 | 5/2013 | Augusto | |
| 8,629,386 B2 | 1/2014 | Bermak et al. | |
| 9,997,549 B2* | 6/2018 | Kim | H01L 27/142 |
| 2017/0309656 A1 | 10/2017 | Kim | |

OTHER PUBLICATIONS

I. Cevik et al., "A 0.8V 140nW Low-Noise Energy Harvesting CMOS APS Imager with Fully Digital Readout", IEEE Custom Integrated Circuits Conference, pp. 5-8, 2016.

A. Y. Chiou et al., "A 137 dB Dynamic Range and 0.32 V Self-Powered CMOS Imager With Energy Harvesting Pixels", IEEE Journal of Solid-State Circuits, vol. 51, No. 11, pp. 2769-2776, 2016.

C. Shi et al., "A Novel Asynchronous Pixel for an Energy Harvesting CMOS Image Sensor", IEEE transactions on very large scale integration (VLSI) systems. vol. 19, No. 1, pp. 118-129, 2011.

A. Fish et al., "CMOS Image Sensors with Self-Powered Generation Capability", IEEE Transactions on Circuits and Systems II: Express Briefs, vol. 53, No. 11, pp. 1210-1214, 2006.

J. Im et al., "A 40 mV Transformer-Reuse Self-Startup Boost Converter with MPPT Control for Thermoelectric Energy Harvesting", IEEE Journal of Solid-State Circuits, vol. 47, No. 12, pp. 3055-3067, 2012.

C. Shi et al., "A Novel Asynchronous Pixel for an Energy Harvesting CMOS Image Sensor," IEEE Trans. Very Large Scale Integr. Syst., vol. 19, No. 1, pp. 118-129, 2011.

I. Cevik, "An Ultra-Low Power Energy Harvesting and Imaging (EHi) Type CMOS APS Imager With Self-Power Capability", Regular Papers, vol. 62, No. 9, pp. 2177-2186, Sep. 2015.

International Search Report corresponding to International Application No. PCT/US2019/019263, dated Jun. 12, 2019, 3 pages.

Written Opinion corresponding to International Application No. PCT/US2019/019263, dated Jun. 12, 2019, 8 pages.

\* cited by examiner

| | Cevik [2] TCAS-I 2015 | | Chiou [3] JSSC 2016 | Pixel Structure I | Pixel Structure II |
|---|---|---|---|---|---|
| Process | 0.35 μm | | 0.18 μm | 0.18 μm | 0.18 μm |
| Pixel type | 3T & EH | | PWM & EH | 3T & EH | 3T & EH |
| Pixel size | 18 × 18 μm² | | 7.6 × 7.6 μm² | 5 × 5 μm² | 5 × 5 μm² |
| Pixel array | 65 × 45 | | 256 × 192 | 100 × 90 | 100 × 90 |
| Fill factor | 42.5% (PD1) | 65% (PD2) | 30.8 % | 46% (photodiode) 94%(energy harvesting) | 44.7% (photodiode) 58%(energy harvesting) |
| Power supply | 0.85 V | | 0.4V | 0.6V | 0.6V |
| Power generation | 46.0 μW @ 57 Klux | 16.7 μW @ 20 klux | 14 μW @ 80 Klux | 11.4 μW @ 50 klux 4.22 μW @ 20 klux | 2.48 μW @ 50 klux 0.9 μW @ 20 klux |
| Normalized power generation | 865 pW/lux·mm² | | 82.2 pW/lux·mm² | 998 pW/lux·mm² | 217 pW/lux·mm² |
| Power consumption | 0.9 μW @ 1.6 fps | 9.0 μW @ 21 fps | 10.6 μW @ 6.5 fps 32.1 μW @ 16.5 fps | 3.9 μW @ 7.5 fps 10.08 μW @ 15 fps | 4.0 μW @ 7.5 fps 11.02 μW @ 15 fps |
| FOM | 195 pJ/pixel @ 1.6 fps | 149 pJ/pixel @ 21 fps | 33.2 pJ/pixel @6.5 fps 39.6 pJ/pixel @16.5 fps | 57.8 pJ/pixel @7.5 fps 74.7 pJ/pixel @15 fps | 59.2 pJ/pixel @7.5 fps 81.6 pJ/pixel @15 fps |
| Self-powered operation | N/A | | 4.1 fps @ 60 klux | 7.5 fps @ 20 klux 15 fps @ 50 klux | 7.5 fps @70 klux |

*Figure 7*

IMAGING SENSOR AND PIXEL STRUCTURE FOR SIMULTANEOUS IMAGING AND ENERGY HARVESTING

TECHNICAL FIELD

The present disclosure relates to semiconductor devices for imaging and energy harvesting.

BACKGROUND

Complementary metal-oxide semiconductor (CMOS) image sensors have been widely used fir distributed IoT sensor nodes for continuous monitoring of environments due to their small form factor and low power consumption. These distributed IoT sensor nodes should be able to operate and cover comprehensive, unreachable areas under a limited energy source. To further extend the lifetime of the distributed sensor nodes, several potential energy harvesting methods has been explored, including vibration, radiation, solar energy, etc. Among these, photovoltaic energy harvesting showed a high potential to support remotely-distributed IoT image sensors due to its high energy is harvesting efficiency and compatibility with conventional CMOS processes. However, in previous works, the efficiency of a photovoltaic (energy harvesting) and a photodetection (imaging) operations for the CMOS image sensors is limited since they assign for each photovoltaic and photodetection operation by the time-division technique or placing the separated additional diode in the same plane. Examples of these multiplexing imaging/energy harvesting devices are disclosed by I. Cevik and S. U. Ay, "A 0.8V 140 nW Low-Noise Energy Harvesting CMOS APS Imager with Fully Digital Readout," in IEEE Custom Integrated Circuits Conference, 2014, pp. 5-8. DOI: 10.1109/CICC.2014 0.6946128 ("Cevik") as well as A. Y. Chiou, and C. Hsieh, "A 137 dB Dynamic Range and 0.32 V Self-Powered CMOS Imager With Energy Harvesting. Pixels," IEEE Journal of Solid-State Circuits, vol. 51, no. 11, pp. 2769-2776, 2016 ("Chiou"). The pixels in Cevik and Chiou use a reconfigurable PN-junction diode that switches between photodetection (photocurrent generation) and the photovoltaic (solar cell) operations: However, this pixel structure does not provide continuous video images due to mode switching. Another approach to achieving both imaging and energy harvesting is to use two separate photodiodes in a side-by-side arrangement for imaging and photovoltaic operations simultaneously. However, this approach inevitably leads to a low fill factor and a large pixel size, which lead the low efficiency for the energy harvesting and the imaging mode.

SUMMARY

In accordance with one aspect of the invention, there is provided an imaging sensor having a substrate and a pixel array comprising a plurality of pixel structures formed on the substrate, wherein each of the pixel structures includes a $P+/N_{WELL}/P_{SUB}$ junction forming a first, photodiode overlying a second, photovoltaic diode.

In one or more embodiments, the $P+/N_{WELL}/P_{SUB}$ junction of each of the pixel structures forms the photodiode and the photovoltaic diode as a pair of cathode-connected diodes with the photodiode having a P+ layer forming an anode located at an upper portion of the pixel structure and an $N_{WELL}$ layer forming a cathode underlying the P+ layer, and with the photovoltaic diode having the $N_{WELL}$ layer forming a cathode of the photovoltaic diode and a $P_{SUB}$ layer forming an anode of the photovoltaic diode that is located at a lower portion of the pixel structure underlying the $N_{WELL}$ layer. The anode of the photodiode may include a first electrode with each of the pixel structures including readout circuitry connected to the first electrode, and with the pixel structure further is including a second electrode connected to the photovoltaic diode.

In some embodiments, the imaging sensor may further comprise a voltage output terminal supported by the substrate, wherein the second electrodes of each of the pixel structures are electrically coupled to the output terminal so as to provide harvested electrical energy to the output terminal. The imaging sensor may also include a voltage input terminal supported by the substrate and coupled to the pixel array to provide operating power to the imaging sensor from an external power supply that converts the harvested electrical energy from the output terminal into the operating power received at the input terminal. The anode of the photovoltaic diode is connected to the second electrode to supply the harvested electrical energy to the output terminal, wherein the pixel structure includes an N+ region formed in the $N_{WELL}$ layer at the upper portion of the pixel structure adjacent the P+ layer, and wherein the N+ region is connected to a bias voltage source that provides positive voltage to the cathode of the photovoltaic diode to thereby reverse bias the photovoltaic diode.

In one or more embodiments, the pixel structure may include an N+ region formed in the $N_{WELL}$ layer at the upper portion of the pixel structure adjacent the P+ layer, wherein the second electrode is connected to the N+ region, and wherein the anode of the photovoltaic diode is connected to a circuit ground.

In at least some embodiments, each of the pixel structures includes reset circuitry connected to the first electrode.

In some embodiments, each of the pixel structures includes readout circuitry and the imaging sensor further comprises a column read circuit connected to the pixel readout circuitry, wherein the column readout circuit includes an analog to digital converter (ADC) that detects a voltage level provided by the photodiode, a resettable counter that provides a digital value indicative of the detected voltage level, and a latch that stores the digital value at least until the digital value is read out from the latch.

In one embodiment, each pixel structure includes readout circuitry and pixel circuitry that together comprise a 3T pixel formed from PMOS transistors inside the $N_{WELL}$.

In accordance with another aspect of the invention, there is provided an energy harvesting imaging sensor comprising an array of $P+/N_{WELL}/P_{SUB}$ junctions each forming a vertically stacked photodiode and photovoltaic diode pair.

In accordance with another aspect of the invention, there is provided an energy harvesting pixel imaging structure comprising a semiconductor having a photodiode overlying a photovoltaic diode. The semiconductor in some embodiments may be a complementary metal-oxide semiconductor, and the photodiode and photovoltaic diode together can be implemented as a vertically stacked. $P+/N_{WELL}/P_{SUB}$ junction.

In accordance with yet another aspect of the invention, there is provided a method of simultaneous imaging and energy harvesting, comprising the steps of generating charge in a photodiode indicative of light impinging on the photodiode and simultaneously generating charge from the light in a photovoltaic diode located underneath the photodiode. In at least some embodiments, the steps of generating charge may further comprise generating the charge using a $P+/N_{WELL}/P_{SUB}$ junction. Also, in one or more embodiments, the photodiode and photovoltaic diode form a portion of a pixel structure having a readout circuit, and the method further comprises carrying out the charging steps at each of a plurality of said pixel structures formed into an array. The method may also further comprise the steps of: accumulating the charge from the photodiodes at each pixel structure in the array, providing the charge from the photovoltaic diodes of each of the pixel structures to a power management circuit, receiving operating power from the power management circuit that was generated using the charge from the photovoltaic devices, and reading out the accumulated charge at each of the pixel structures using the readout circuit that is powered using the operating power received from the power management circuit.

BRIEF DESCRIPTION OF THE DRAWINGS

One or more embodiments of the invention will hereinafter b described in conjunction with the appended drawings, wherein like designations denote like elements, and wherein:

FIG. 7 is a table comparing the performance of the prototype imaging sensor with two known multiplexing imaging/energy harvesting devices.

DETAILED DESCRIPTION OF THE ILLUSTRATED EMBODIMENTS

Described below are embodiments of a method and device for providing self-sustainable CMOS image sensing with concurrent energy harvesting without additional area penalty of photodiodes or the degradation of energy-harvesting efficiency as are experienced with known techniques. The proposed pixel structures described below utilize two vertically-stacked diodes realized in the same pixel using a conventional CMOS fabrication process: one diode for hole-accumulation photodiode (P+/$N_{WELL}$) inside the N-well and the other diode for the photovoltaic energy harvesting diode ($N_{WELL}/P_{SUB}$) below the N-well.

Figure 1D:
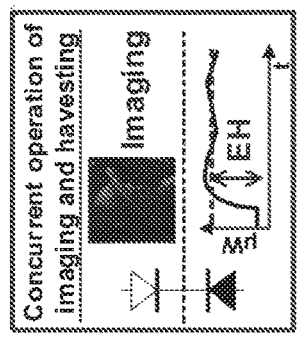
FIG. 1D shows the relative functions of the photodiodes and photovoltaic diodes in the pixel structures used in the imaging sensor of FIG. 1A.
Figure 1A:
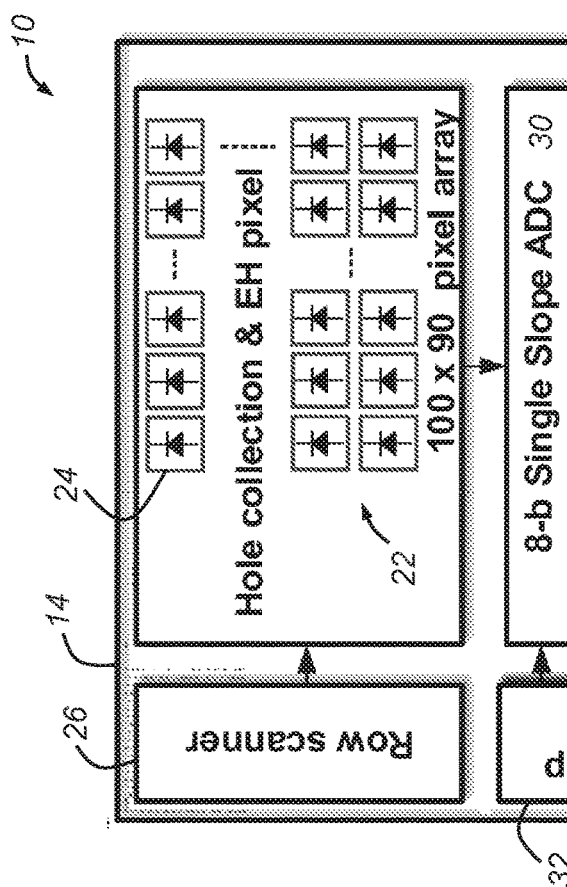
FIG. 1A is a diagram of an imaging sensor and external power management circuit constructed in accordance with an embodiment of the invention.

FIG. 1A depicts an imaging sensor 10 with an external power management circuit 12 that receives harvested electrical charge from the imaging sensor 10 and stores and conditions it into the voltage supply(ies) needed to run the imaging sensor. The imaging sensor 10 is a semiconductor device that includes a substrate 14 containing at least one input 16 ($V_{IN}$) and at least two outputs 18 ($V_{EH}$) and 20 (DATA), all of which may be formed as terminals on the substrate 14. Formed on the substrate 14 using a CMOS fabrication process is a pixel array 22 containing an n×m array of pixel structures 24 (also referred to simply as pixels), two examples of which are shown generally in FIGS. 1B and 1C. These will be described in greater detail below in connection with FIGS. 2 and 3. Also formed on the substrate 14 are additional CMOS circuits including a row scanner 26 and column scanner 28, analog-to-digital converter (ADC) 30 run by a ramp signal generator 32, a counter 34, and a latch 36 that temporarily stores bytes of imaging data until output via the DATA output 20. These additional circuits 26-36 may be implemented in various ways as are known to those skilled in the art, including by the use of conventional circuits that may be fabricated onto the substrate 14.

Figure 1B:
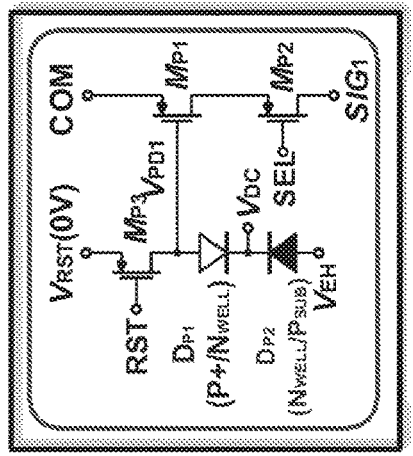
FIG. 1B is a schematic diagram of one embodiment of a pixel structure that includes a photodiode and photovoltaic diode and that may be used in the imaging sensor of FIG. 1A.
Figure 1C:
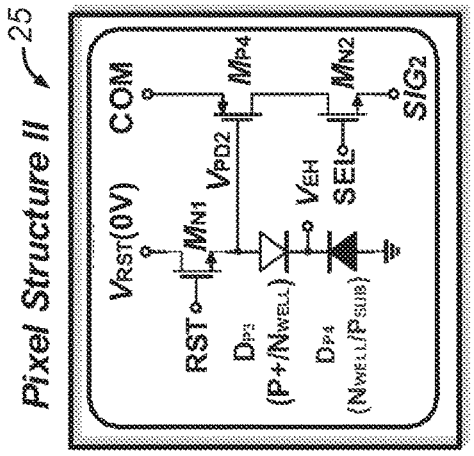
FIG. 1C is a schematic diagram of another embodiment of a pixel structure that includes a photodiode and photovoltaic diode and that may be used in the imaging sensor is of FIG. 1A.

FIGS. 1B and 1C depict circuit diagrams for two different embodiments 23, 25 either of which may be used to form the pixel structures 24. Each pixel structure includes a photodiode ($D_{P1}$, $D_{P3}$) for imaging and a photovoltaic diode ($D_{P2}$, $D_{P4}$) for energy harvesting. Contrary to typical CMOS image sensors, these two diodes, $D_{P1}$ and $D_{P3}$, accumulate holes, not electrons. Holes generated by incident light are drifted to and collected in the anode of the diode. In a pixel structure 23, $D_{P1}$ forms a 3T pixel with $M_{P1}$, $M_{P2}$ and reset transistor ($M_{P3}$), accumulating photocurrent in VPDI during integration time. $D_{P2}$ continuously harvests energy from impinging light without any interruption, producing the photovoltage at $V_{EH1}$. In the pixel structure 25, $D_{P3}$ forms a 3T pixel with $M_{P4}$, $M_{N2}$ and reset transistor ($M_{N1}$), which collect the generated photocurrent in $V_{PD2}$ during integration time. $D_{P4}$ continuously collects electrons to harvest energy without any interruption, and thus with impinging light will continually produce the negative photovoltage at $V_{EH2}$. Column-parallel 8-b singleslope (SS) ADCs 18 operate in the delta-reset sampling mode with a bi-directional ramp signal generator and an 8-b counter 34 for image capturing at low power. FIG. 1D depicts the relative functions of the photodiode and photovoltaic diode in the pixel structures 24.

Figure 2:
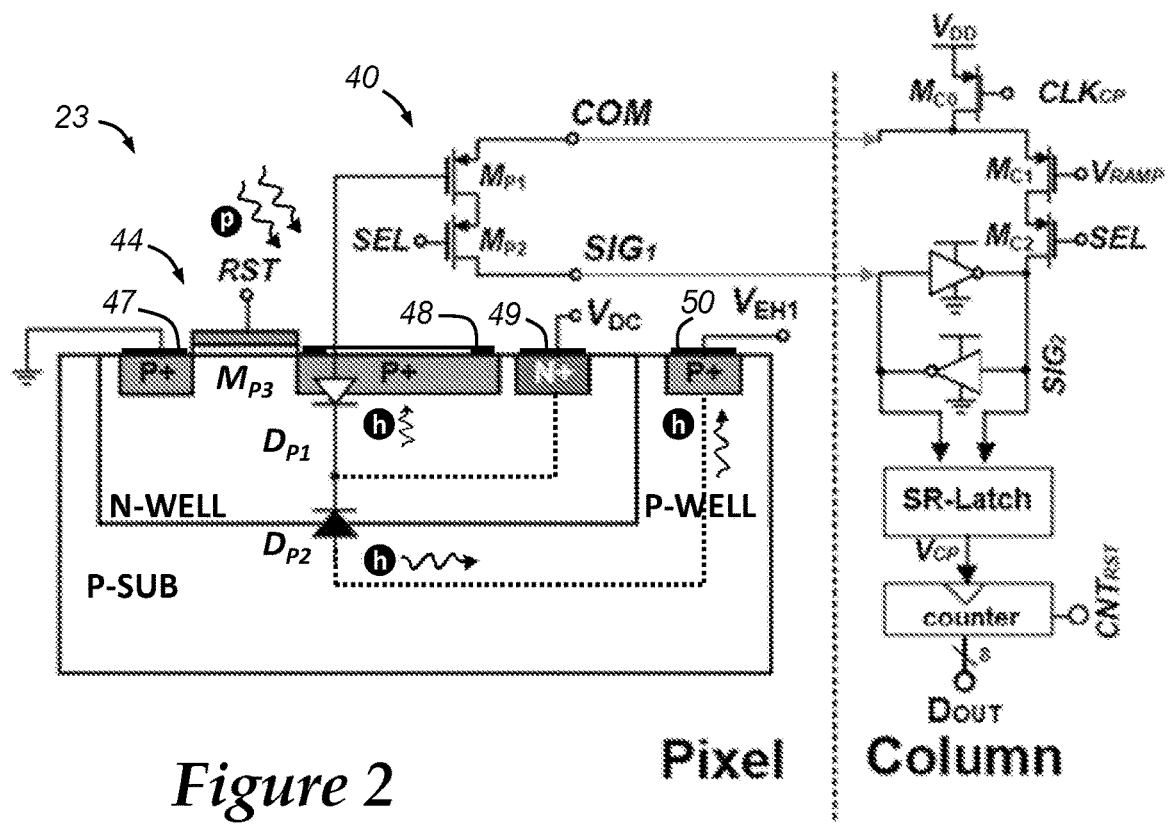
FIG. 2 depicts the pixel structure of FIG. 1B along with a column read circuit.
Figure 3:
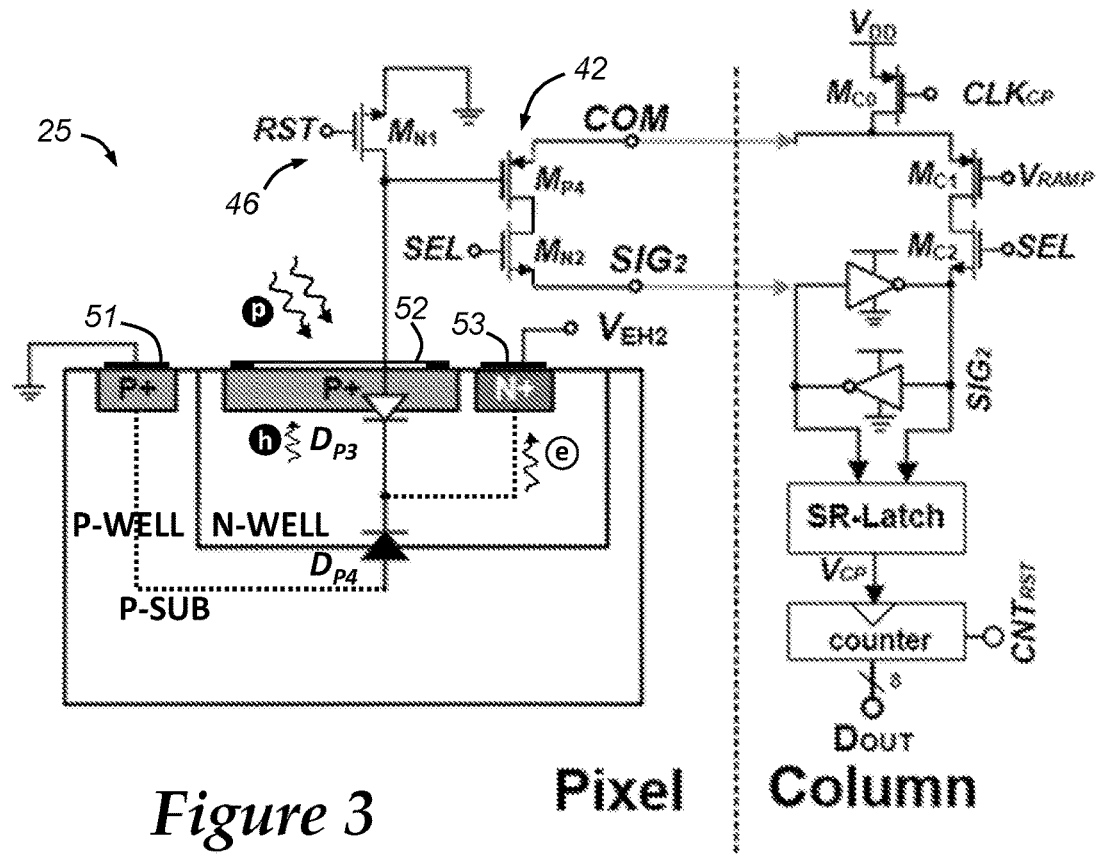
FIG. 3 depicts the pixel structure of FIG. 1C along with a column read circuit.

FIGS. 2 and 3 show the pixel cross-section and the readout circuitry for the two different pixel structures 23 and 25, respectively. Both pixel structures include a P+/$N_{WELL}$/$P_{SUB}$ junction forming a first, photodiode ($D_{P1}$ and $D_{P3}$) overlying a second, photovoltaic diode ($D_{P2}$ and $D_{P4}$). The stacked vertical junction structure of P+/$N_{WELL}$/$P_{SUB}$ forms these diodes as a pair of cathode-connected diodes with the photodiodes DPI and DPS having a P+ layer forming an anode located at an upper portion of the pixel structure and an $N_{WELL}$ layer forming a cathode underlying the P+ layer. The photovoltaic diodes $D_{P2}$ and $D_{P4}$ have the $N_{WELL}$, layer forming a cathode of the photovoltaic diode and a $P_{SUB}$ layer forming an anode of the photovoltaic diode that is is located at a lower portion of the pixel structure underlying the $N_{WELL}$ layer. In both pixel structures 23 and 25, the $N_{WELL}$ layer is formed in (surrounded by) the $P_{SUB}$ layer which extends from the lower portion of the pixel structure to the upper portion of the pixel structure about the periphery of the $N_{WELL}$ layer. This provides for an electrical path from the photovoltaic diode $D_{P2}$ and $D_{P4}$ to the upper portion of the pixel structure where holes generated in the $P_{SUB}$ layer can migrate and be used for supplying the harvested energy from the pixel structure.

In the pixel structure 23 of FIG. 2, the semiconductor includes an N+ region formed at the upper portion of the pixel structure in the $N_{WELL}$ layer, and further includes a P+ region formed in the Mint layer at the upper portion. As shown, the P+ region provides a ground reference while the N+ region provides an external connection to the diodes' cathodes that permits application of a positive voltage $V_{DC}$ that reverse biases the photovoltaic diode $D_{P2}$, thereby increasing the width of the depletion region and improving energy harvesting efficiency. The pixel structure 23 also includes a P+ region formed at the upper portion of the pixel structure in a portion of the $P_{SUB}$ layer that forms a $P_{WELL}$ at a location laterally adjacent the $N_{WELL}$ layer. This provides an anode connection for the photovoltaic diode $D_{P2}$ to which the holes generated in the $P_{SUB}$ layer can migrate so as to supply harvested energy from the pixel structure. There are thus four patterned regions at the upper portion of the pixel structure: the P+ anode of the photodiode $D_{P1}$, the N+ cathode of the diodes $D_{P1}$ and $D_{P2}$, the P+ anode of the photovoltaic diode layer $D_{P2}$ that supplies harvested charge, and the P+ ground connection, Each of these four regions may include a metal layer electrode (47-50) overlying the region for external connection via patterned traces on the semiconductor. The electrode 48 for the photodiode anode may be, for example, a ring electrode that provides an open region of the P+ layer to receive impinging light, or an overlying transparent electrode such as may be formed from indium tin oxide (ITO).

In the pixel structure 25 of FIG. 3, the semiconductor includes an N+ region formed at the upper portion of the pixel structure in the $N_{WELL}$ layer, and further includes a P+ region formed at the upper portion of the pixel structure in a $P_{WELL}$, portion of the $P_{SUB}$ layer at a location laterally adjacent the $N_{WELL}$ layer. With this P+ region connection to ground, the common-cathode connection provided by the N+ region permits conduction of the harvested energy. Each of these doped regions at the upper portion of the pixel is structure 25 may include an electrode (51-53) for low resistance connection to the remainder of the imaging sensor circuitry, as noted above in connection with the pixel structure 23 of FIG. 2.

Regardless of which one (or both) of the pixel structures 23 and 25 are used in the imaging sensor 10 of FIG. 1, the electrodes supplying the harvested energy $V_{EH1}$ and $V_{EH2}$ shown in FIGS. 2 and 3 are electrically coupled to the $V_{EH}$ output 18, and this can be done in various ways such as by a direct electrical connection of the electrodes $V_{EH1}$, $V_{EH2}$ to that output terminal 18 or by OR-tying the electrodes to the output terminal using steering diodes. The harvested energy supplied to output terminal 18 may then be used by the external power management circuit 12 which stores the charge, boosts the voltage level if needed, and provides a regulated and filtered supply of operating power to the imaging sensor 10 for running its circuitry, including $V_{DD}$ as well as the bias voltage $V_{DC}$ used in the pixel structure 23.

Each pixel structure 23 and 25 includes readout circuitry 40 and 42, respectively, as well as a reset circuit 44 and 46, respectively. The readout circuitry is connected to the electrode of the P+ anode region of the photodiode $D_{P1}$ and $D_{P3}$ to accumulate photon-induced charge (holes) generated in the $N_{WELL}$ depletion region. That electrode is connected to the gate of an input transistor ($M_{P1}$ and $M_{P4}$), which is a part of the comparator circuit for the singleslope ADC 30. During readout, the level of accumulated charge is sensed when the pixel is selected by the row scanner 26 and column scanner 28, and this readout is done by the column readout circuitry that comprises the ADC 30 and its signal generator 32, counter 34, and the latch 36 which is connected to the 8-b image DATA output terminal 20. For resetting the photodetector signal at the pixel structure 23, 25, the P+ diffusion layer (anode of the $D_{P1}$ and $D_{P3}$) is connected to the reset transistor ($M_{P3}$ and $M_{N1}$) that comprises the reset circuitry 44, 46, respectively.

In the pixel structure 23, the peripheral transistors of the readout and reset circuitry 40, 44 ($M_{P1}$, $M_{P2}$ and $M_{P3}$) are implemented as PMOS transistors inside the $N_{WELL}$. This results in a high till factor of 47% for $D_{P1}$. Moreover, the energy harvesting efficiency can be greatly enhanced by using the entire N-well area realized by the $N_{WELL}/P_{SUB}$ diode ($D_{P2}$). $D_{P2}$ can achieve a near perfect fill factor (>94%) in a small pixel of 5 um×5 um. In the pixel structure 25, $D_{P4}$ collects the electrons to harvest the energy. Comparing the pixel structure 23, the harvested electrons drift through $N_{WELL}$, which can show relatively low series resistance to $V_{EH2}$ node due to the higher doping concentration than the $P_{SUB}$ layer in the pixel structure 23. In addition, it should be noted that the amount of photo-generated charges are not only determined by the area of the diode but also the depletion width. The $P_{SUB}$ and $N_{WELL}$ areas are lightly doped as compared to P+ or N+ regions. Therefore, a larger depletion width can be formed in $D_{P2}$ and $D_{P4}$, resulting in a higher energy harvesting efficiency. When the incident light reaches the depletion regions of $D_{P1}$ and $D_{P3}$, the holes are generated and drifted to the anode. The accumulated holes in $D_{P1}$ and $D_{P3}$ during the integration time will be read out for image captures, using the two transistors in the each pixel structure with other two transistors in the column ($M_{C1}$, $M_{C2}$) as a differential pair in the comparator for SS ADC 18 and sharing the COM node and SIG1 node in the same column. A the same time, the accumulated holes in $D_{P2}$ are used for energy harvesting, supplying the photovoltage at $V_{EH1}$. The generated electrons in $D_{P4}$ are supplying negative photovoltage at $V_{EH2}$.

It will this be understood that the imaging sensor 10, using either of the energy harvesting pixel imaging structures described above, can be used to carry out a method of simultaneous imaging and energy harvesting. This method includes the steps of generating charge in a photodiode (e.g., $D_{P1}$ or $D_{P3}$) indicative of light impinging on the photodiode and simultaneously generating charge from the light in a photovoltaic diode (e.g., $D_{P2}$ or $D_{P4}$) located underneath the photodiode. And, more specifically, that this photodetection and energy harvesting charge can be generated using a P+/$N_{WELL}/P_{SUB}$ junction, Where this pixel structure is one of a multitude of such structures integrated as a semiconductor array with readout circuitry, then the method may further comprise the steps of: accumulating the charge from the photodiodes at each pixel structure in the array, providing the charge from the photovoltaic diodes of each of the pixel structures to a power management circuit; receiving operating power from the power management circuit that was generated using the charge from the photovoltaic devices, and reading out the accumulated charge at each of the pixel structures using the readout circuit that is powered using the operating power received from the power management circuit.

Figure 4:
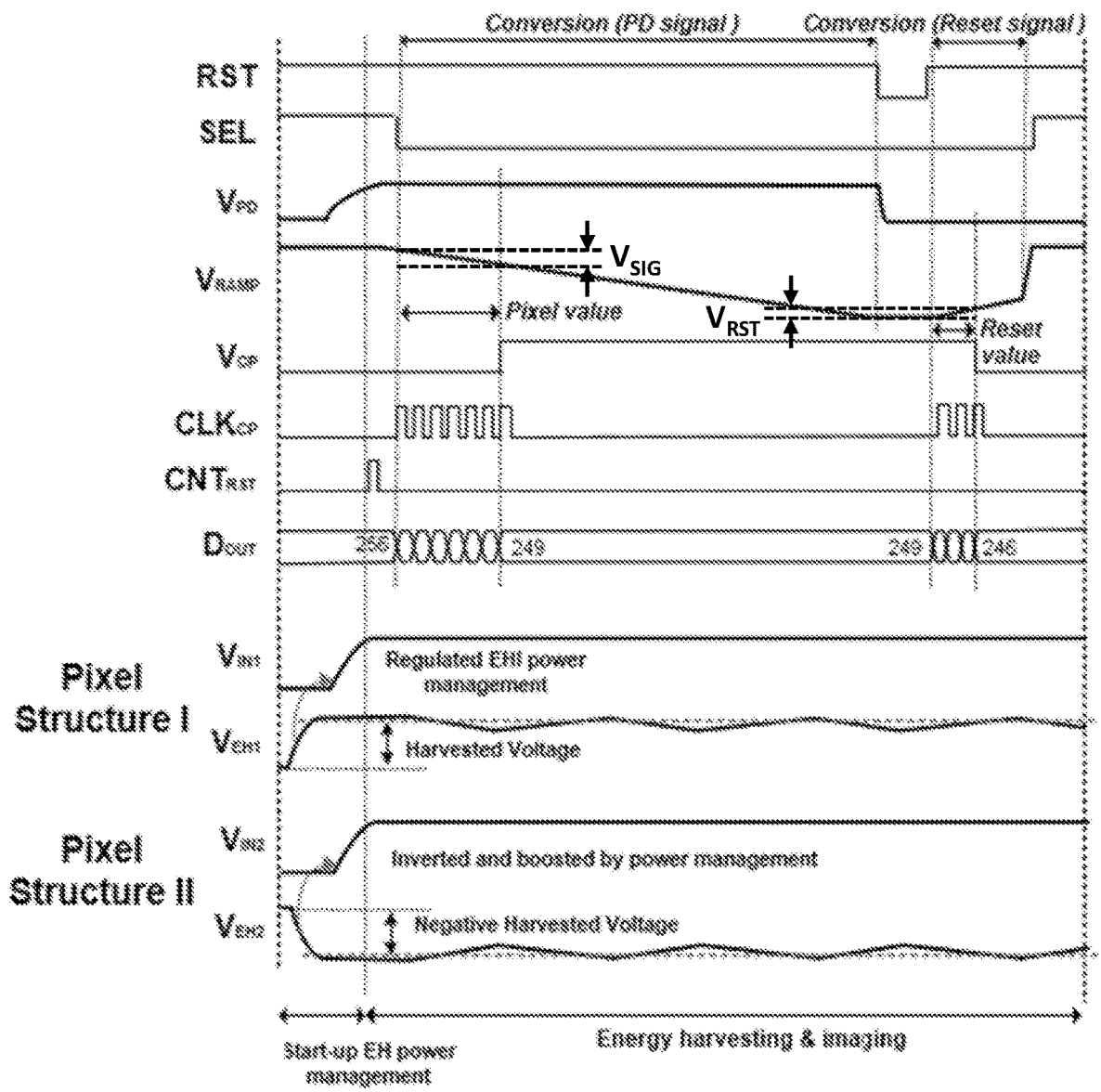
FIG. 4 is a graph of the timing diagram of the inputs and outputs for the pixel structures of FIGS. 2 and 3.

A timing diagram for imaging and energy harvesting is shown in FIG. 4. Impinging (incident) light on the photodiode starts generating electron/hole pairs. In the pixel structure 23, the voltage of energy harvesting node ($V_{EH1}$) increases during the start-up phase, and the combined output from the $V_{EH1}$ pixel nodes is supplied to the external energy harvest (EH) power management circuit 12 via $V_{EH}$ output terminal 18. When this combined output at terminal 18 reaches a trigger voltage, the power management circuit 12 starts supplying power back to the imaging sensor 10 via terminal 16 and thus, to the individual pixel structures 24 in the array 22. The image capture and readout may then start. In the pixel structure 25, the voltage of energy harvesting node ($V_{EH2}$) decreases due to the harvested electrons flowing to $V_{EH}$ output terminal 18 during the start-up phase. The harvested voltage is inverted to positive voltage using the power management circuit 12 which can generate supply voltage by boosting up from the inverted harvesting voltage, as is known.

The image capture operation of both pixel structures is conducted as follows: (1) $CNT_{RST}$ signal resets the code of the counter to 2.56; (2) $V_{RAMP}$ starts decreasing to capture the $D_{P1}$ and $D_{P3}$ signal level ($V_{PD1}$, $V_{PD2}$); (3) when $V_{RAMP}$ reaches the $D_{P1}$ and $D_{P3}$ signal level; the counter latched the code corresponding to $V_{PD1}$ and $V_{PD2}$; (4) after resetting the photodiode ($D_{P1}$, $D_{P3}$), $V_{RAMP}$ starts increasing to detect the reset signal level of $D_{P1}$ and $D_{P3}$; (5) when $V_{RAMP}$ reach the $D_{P1}$ reset signal level, the counter latch the code equivalent to ($V_{SIG}-V_{RST}$). By employing the bi-directional ramp signal for delta-reset sampling operation, any fixed pattern noise (FPN) induced by variations and mismatches of $M_{P3}$ and $M_{P4}$ may be suppressed.

Figure 5:
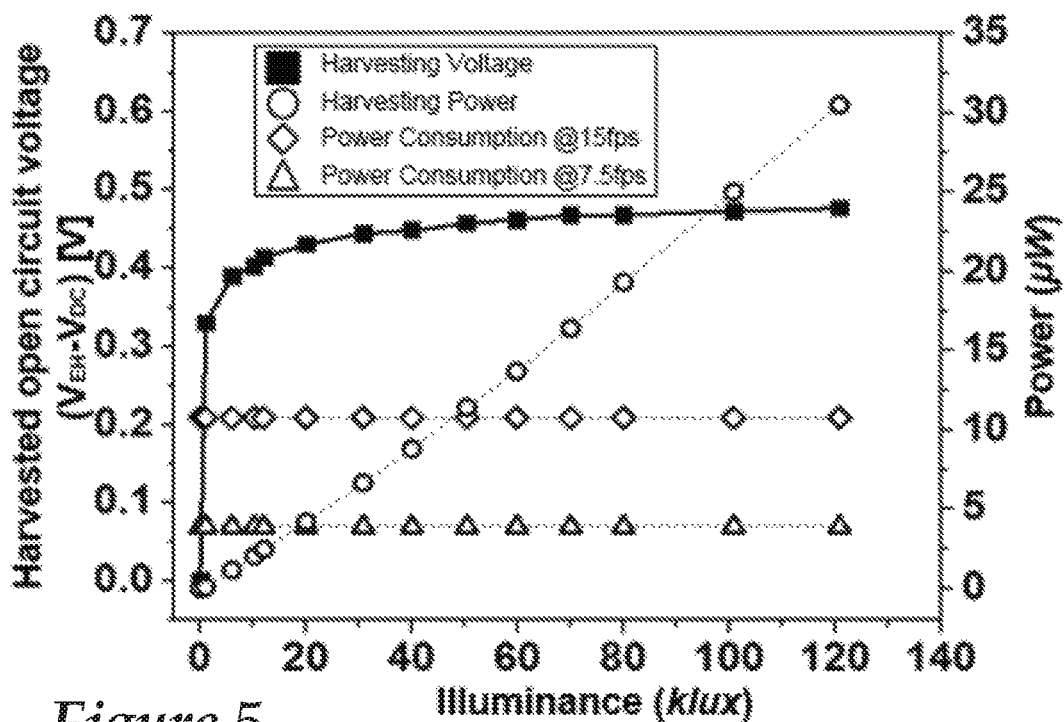
FIGS. 5 and 6 show the measured harvested power and power dissipation of a prototype imaging sensor as a function of illumination levels for each pixel structure of FIGS. 2 and 3.
Figure 6:
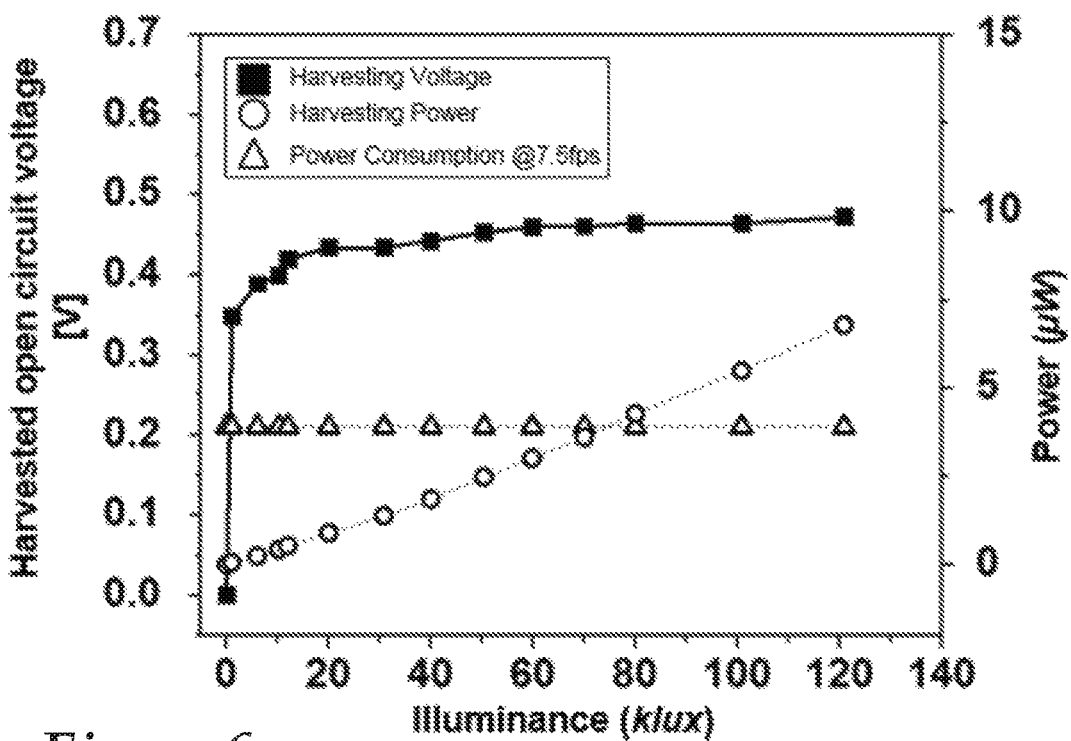

A prototype imaging sensor was constructed using each of the pixel structures 23 and 25, and performance was measured with LSH-7320 LED Solar Simulator (Oriel Instrument). FIGS. 5 and 6 show the measured harvested power, and power dissipation of the sensor as a function of illumination levels for each pixel structure 23 and 25, respectively. When the illumination is higher than 1 klux, the harvested supply voltage can reach higher than 0.33V, which is sufficient to start up and operate the external EH power management circuit. The Voc of the two devices are saturated at about 0.45 V and the ISC is proportional to the illumination levels. In the pixel structure 23, the harvested energy is sufficient to continuously supply the required power of 3.9 uW at 7.5 fps of image capture to under 20 klux (normal daylight) and 10.08 uW at 15 fps under 50 klux (sunny daylight), respectively. In the pixel structure 25, the harvested energy can provide continuously required power of 4.0 uW at 7.5 fps under 70 klux (normal daylight).

The performance comparison of imaging sensors using the two pixel structures relative to the devices of Cevik and Chiou is summarized in FIG. 7. The fabricated pixel structures disclosed herein accomplished a figure of merit (FOM) of 57.78 pJ/pixel and 74.67 pJ/pixel at 7.5 fps and 1.5 fps in the image capturing circuits for the pixel structure 23 and 59.2 pJ/pixel and 81.6 pJ/pixel at 7.5 fps and 15 fps for pixel structure 25. Thus, harvest a power level of 998 pW/klux/mm² can be harvested from the pixel structure 23 and 217 pW/klux/mm² from the pixel structure 25, respectively. This result indicates the CMOS image sensor with the proposed pixel structures show the self-sustainable image-capture operation without requiring a battery or other external source of electrical power.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, instead of the P+/$N_{WELL}$/$P_{SUB}$ junction, an N+/$P_{WELL}$/$DN_{WELL}$ junction could be used with the N+/$P_{WELL}$ diode used for capturing the image and the $P_{WELL}$/$DN_{WELL}$ photovoltaic diode used for energy harvesting. The construction and use of the N+/$P_{WELL}$/$DN_{WELL}$ junction will be apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation. In addition, the term "and/or" is to be construed as an inclusive OR. Therefore, for example, the phrase "A, B, and/or C" is to be interpreted as covering all of the following: "A" "B"; "C" "A and B"; "A and C"; "B and C"; and "A, B, and C."

The invention claimed is:

1. An imaging sensor, comprising:
   a substrate;
   a pixel array comprising a plurality of pixel structures formed on the substrate, wherein each of the pixel structures includes a P+/$N_{WELL}$/$P_{SUB}$ junction forming a first, photodiode overlying a second, photovoltaic diode.

2. The imaging sensor set forth in claim 1, wherein the P+/$N_{WELL}$/$P_{SUB}$ junction of each of the pixel structures forms the photodiode and the photovoltaic diode as a pair of cathode-connected diodes with the photodiode having a P+ layer forming an anode located at an upper portion of the pixel structure and an $N_{WELL}$ layer forming a cathode underlying the P+ layer, and with the photovoltaic diode having the $N_{WELL}$ layer forming a cathode of the photovoltaic diode and a $P_{SUB}$ layer forming an anode of the photovoltaic diode that is located at a lower portion of the pixel structure underlying the $N_{WELL}$ layer.

3. The imaging sensor set forth in claim 2, wherein the anode of the photodiode includes a first electrode and wherein each of the pixel structures includes readout circuitry connected to the first electrode, and wherein the pixel structure further includes a second electrode connected to the photovoltaic diode.

4. The imaging sensor set forth in claim 3, further comprising a voltage output terminal supported by the substrate, wherein the second electrodes of each of the pixel structures are electrically coupled to the output terminal so as to provide harvested electrical energy to the output terminal.

5. The imaging sensor set forth in claim 4, further comprising a voltage input terminal supported by the substrate and coupled to the pixel array to provide operating power to the imaging sensor from an external power supply that converts the harvested electrical energy from the output terminal into the operating power received at the input terminal.

6. The imaging sensor set forth in claim 5, wherein the anode of the photovoltaic diode is connected to the second electrode to supply the harvested electrical energy to the output terminal, wherein the pixel structure includes an N+ region formed in the $N_{WELL}$ layer at the upper portion of the pixel structure adjacent the layer, and wherein the N+ region is connected to a bias voltage source that provides positive voltage to the cathode of the photovoltaic diode to thereby reverse bias the photovoltaic diode.

7. The imaging sensor set forth in claim 3, wherein the pixel structure includes an N+ region formed in the $N_{WELL}$ layer at the upper portion of the pixel structure adjacent the P+ layer, wherein the second electrode is connected to the N+ region, and wherein the anode of the photovoltaic diode is connected to a circuit ground.

8. The imaging sensor set forth in claim 3, wherein each of the pixel structures includes reset circuitry connected to the first electrode.

9. The imaging sensor set forth in claim 1, wherein each of the pixel structures includes readout circuitry and wherein the imaging sensor further comprises a column read circuit connected to the pixel readout circuitry, wherein the column readout circuit includes an analog to digital converter (ADC) that detects a voltage level provided by the photodiode, a resettable counter that provides a digital value indicative of the detected voltage level, and a latch that stores the digital value at least until the digital value is read out from the latch.

10. The imaging sensor set forth in claim 1, wherein each pixel structure includes readout circuitry and pixel circuitry that together comprise a 3T pixel formed from PMOS transistors inside the $N_{WELL}$.

11. An energy harvesting imaging sensor comprising an array of $P+/N_{WELL}/P_{SUB}$ junctions each forming a vertically stacked photodiode and photovoltaic diode pair.

12. An energy harvesting pixel imaging structure comprising a semiconductor having a photodiode overlying a photovoltaic diode.

13. The imaging sensor set forth in claim 12, wherein the semiconductor is a complementary metal-oxide semiconductor.

14. The imaging sensor set forth in claim 12, wherein the photodiode and photovoltaic diode together comprise a vertically stacked $P+/N_{WELL}/P_{SUB}$ junction.

15. A method of simultaneous imaging and energy harvesting, comprising the steps of generating charge in a photodiode indicative of light impinging on the photodiode and simultaneously generating charge from the light in a photovoltaic diode located underneath the photodiode.

16. The method of claim 15, wherein the steps of generating charge further comprise generating the charge using a $P+/N_{WELL}/P_{SUB}$ junction.

17. The method of claim 15, wherein the photodiode and photovoltaic diode form a portion of a pixel structure having a readout circuit, and wherein the method further comprises carrying out the charging steps at each of a plurality of said pixel structures formed into an array.

18. The method of claim 17, further comprising the steps of: accumulating the charge from the photodiodes at each pixel structure in the array, providing the charge from the photovoltaic diodes of each of the pixel structures to a power management circuit, receiving operating power from the power management circuit that was generated using the charge from the photovoltaic devices, and reading out the accumulated charge at each of the pixel structures using the readout circuit that is powered using the operating power received from the power management circuit.

* * * * *